United States Patent [19]

Anderson et al.

[11] Patent Number: 6,163,154
[45] Date of Patent: Dec. 19, 2000

[54] SMALL SCALE NMR SPECTROSCOPIC APPARATUS AND METHOD

[75] Inventors: Marvin H. Anderson, Mountain View; Thomas W. Schleich, Scotts Valley; Boban K. John, Fremont; James N. Shoolery, Mountain View, all of Calif.

[73] Assignee: Magnetic Diagnostics, Inc., Venice, Calif.

[21] Appl. No.: 08/997,072

[22] Filed: Dec. 23, 1997

[51] Int. Cl.[7] ................................................. G01V 3/00
[52] U.S. Cl. ........................................................ 324/320
[58] Field of Search ................................... 324/320, 318, 324/319

[56] References Cited

U.S. PATENT DOCUMENTS

| | | | |
|---|---|---|---|
| 3,017,544 | 1/1962 | Kane et al. | 317/158 |
| 3,182,231 | 5/1965 | Gang et al. | 317/158 |
| 3,325,757 | 6/1967 | Gang | 335/217 |
| 3,358,676 | 12/1967 | Frei et al. | 128/1.3 |
| 3,434,085 | 3/1969 | Gang | 335/297 |
| 3,437,963 | 4/1969 | Gang et al. | 335/298 |
| 3,467,076 | 9/1969 | Frisch et al. | 128/1.3 |
| 3,474,222 | 10/1969 | Gang | 219/210 |
| 3,768,054 | 10/1973 | Neugebauer | 335/304 |
| 4,134,395 | 1/1979 | Davis | 128/2 R |
| 4,325,089 | 4/1982 | Hsu | 360/15 |
| 4,534,358 | 8/1985 | Young | 128/653 |
| 4,590,947 | 5/1986 | Krause | 128/653 |
| 4,593,384 | 6/1986 | Kleijne | 365/228 |
| 4,608,991 | 9/1986 | Rollwitz | 128/653 |
| 4,635,643 | 1/1987 | Brown | 128/653 |
| 4,667,176 | 5/1987 | Matsuda | 340/52 |
| 4,672,346 | 6/1987 | Miyamoto et al. | 335/296 |
| 4,674,513 | 6/1987 | Jasper, Jr. | 128/653 |
| 4,677,383 | 6/1987 | Ohuchi | 324/309 |
| 4,684,889 | 8/1987 | Yamaguchi et al. | 324/308 |
| 4,777,464 | 10/1988 | Takabatashi et al. | 335/306 |
| 4,839,059 | 6/1989 | Leupold | 210/335 |

(List continued on next page.)

FOREIGN PATENT DOCUMENTS

| | | |
|---|---|---|
| 1360606 | 7/1974 | United Kingdom . |
| WO 97/15227 | 5/1997 | WIPO . |
| WO 97/30629 | 8/1997 | WIPO . |

OTHER PUBLICATIONS

Chen et al. "Localized $^1$H NMR measurement of glucose consumption in the human brain during visual stimulation" *Proc. Natl. Acad. Sci. USA* 90:9896–9900 (1993).

Merboldt et al. "Decrease of Glucose in the Human Visual Cortex during Photic Stimulation" *Magnetic Resonance in Medicine* 25:187–194 (1992).

(List continued on next page.)

*Primary Examiner*—Christine K. Oda
*Assistant Examiner*—Tiffany A. Fetzner
*Attorney, Agent, or Firm*—Heller Ehrman White & McAuliffe LLP

[57] ABSTRACT

A magnet assembly for a small scale NMR spectroscopy apparatus suitable for laboratory or home use, generally comprising two permanent magnets facing one another so that the facing surfaces have opposite polarities, a pole cap on each of the two facing surfaces of the permanent magnets, and a plurality of radially polarized canceling magnets disposed about the permanent magnets and pole caps. The design and position of the radially polarized canceling magnets about the tapered pole caps reduces leakage of the magnetic field, to maintain the magnetic field strength and homogeneity within the test region, without a disadvantageous increase in the size, weight and cost of the NMR apparatus. A curved edge ring shim may be used to increase magnetic field homogeneity in the test region. Also provided is a method for measurement of glucose concentration in a fluid using NMR spectroscopy. In one aspect of the invention the fluid is a patient's body fluid and the invention provides for in vivo measurement of the glucose concentration. The method comprises spectral editing in which a RF pulse sequence is used to isolate desired resonances of glucose and thereby facilitate resolution of the glucose signal.

29 Claims, 9 Drawing Sheets

U.S. PATENT DOCUMENTS

| | | | |
|---|---|---|---|
| 4,875,486 | 10/1989 | Rapoport et al. | 128/653 |
| 4,937,545 | 6/1990 | Chaillout et al. | 335/298 |
| 4,994,777 | 2/1991 | Leupold et al. | 335/302 |
| 4,998,976 | 3/1991 | Rapoport | 128/653 |
| 5,036,279 | 7/1991 | Jonsen | 324/307 |
| 5,055,812 | 10/1991 | Abele et al. | 335/210 |
| 5,089,798 | 2/1992 | Miyata | 335/211 |
| 5,095,271 | 3/1992 | Ohlawa | 324/307 |
| 5,132,230 | 7/1992 | Rosenthal et al. | 436/15 |
| 5,231,031 | 7/1993 | Szwergold et al. | 436/63 |
| 5,233,991 | 8/1993 | Wright | 128/653.2 |
| 5,250,284 | 10/1993 | Krongrad | 424/9 |
| 5,320,103 | 6/1994 | Rapoport et al. | 128/653.5 |
| 5,390,673 | 2/1995 | Kikinis | 128/653.2 |
| 5,398,681 | 3/1995 | Kuperschmidt | 128/633 |
| 5,433,196 | 7/1995 | Fiat | 128/632 |
| 5,495,222 | 2/1996 | Abele et al. | 335/306 |
| 5,565,834 | 10/1996 | Hanley et al. | 335/296 |
| 5,592,086 | 1/1997 | Weinstock et al. | 324/318 |
| 5,657,758 | 8/1997 | Posse et al. | 128/653.2 |
| 5,676,143 | 10/1997 | Simonsen et al. | 128/633 |
| 5,685,300 | 11/1997 | Kuenstner | 128/632 |
| 5,752,512 | 5/1998 | Gozani | 128/635 |
| 5,755,665 | 5/1998 | Takahaski et al. | 600/410 |
| 5,771,893 | 6/1998 | Kassai et al. | 128/653.3 |

OTHER PUBLICATIONS

Gruetter et al. "Detection and Assignment of the Glucose Signal in $^1$H NMR Difference Spectra of the Human Brain" *Magnetic Resonance in Medicine* 27:183–188 (1992).

Gruetter et al. "Direct measurement of brain glucose concentrations in humans by $^3$C NMR spectroscopy" *Proc. Natl. Acad. Sci. USA* 89:1109–1112 (1992).

Schupp et al. "Localized Detection of Glioma Glycolysis using Edited $^1$H MRS" *Magnetic Resonance Research in Medicine* 30:18–27 (1993).

P.C.M. van Zijl "In vivo detection of 1–$^{13}$C)–glucose and its metabolic products with proton sensitivity and carbon resolution" *SMRM Abstracts* 11th Annual Meeting (1992).

Bruhn et al. "Proton MRS of Cerebral Glucose in Patients with Diabetes Mellitus" *SMRM Abstracts* 10th Annual Meeting (1991).

Roland Kreis and Brian Ross "Diabetes Mellitus: Cerebral metabolic abnormalities detected by localised $^1$H–MRS" *SMRM Abstracts* 10th Annual Meeting (1991).

Michaelis et al. "Quantification of Cerebral Metabolites in Man. Results Using Short–Echo Time Localized Proton MRS" *SMRM Abstracts* 10th Annual Meeting (1991).

Behar "Separation of Macromolecules from Metabolites in the $^1$H NMR Spectrum of Brain" *SMRM Abstracts* 10th Annual Meeting (1991).

Barker et al. "Quantitation of $^1$H NMR Spectra of the Human Brain" *SMRM Abstracts* 10th Annual Meeting (1991).

Provencher "Estimation of Metabolite Concentrations from Localized in Vivo Proton NMR Spectra" *Magnetic Resonance in Medicine* 30:672–679 (1993).

X. Miao et al. "A Homonuclear Equivalent of the INEPT Experiment. Simplification of Crowded Proton Spectra and Measurement of Unresolved Couplings" *J. Magn. Reson.* Series A(117):128–131 (1995).

Hore et al. "Multiplet Selection in Crowded $^1$H NMR Spectra via Double Quantum Coherence" *J. Amer. Chem. Soc.* 104:4286–4288 (1982).

Mason et al. "Glutathione in whole blood: a novel determination using double quantum coherence transfer proton NMR spectroscopy" *Federation of European Biochemical Societies* 318:30–34 (1993).

Anderson, W.A. Electrical Current Shims for correcting Magnetic Fields, The Review of Scientific Instruments vol. 32, No. 3 pp. 241–250, Mar. 1961.

Merriam Webster's Collegiate College Dictionary Tenth Edition pp. 14, 47, 109, 335, and 1245 1997 no month.

Bushong, Stewart C. Magnetic Resonance Imaging Physical and Biological Principles Second Edition textbook Mosby New York Chapter 11 pp. 128–143 no month, 1996.

Varian Brochure "The EM–360A NMR Spectrometer, low cost, high resolution 60–MHz NMR system" (No Date).

Varian Brochure "The EM–390 NMR Spectrometer, low cost, high performance 90–MHz NMR system" (No Date).

SMALL SCALE NMR SPECTROSCOPIC APPARATUS AND METHOD

BACKGROUND OF THE INVENTION

This invention relates to the field of nuclear magnetic resonance (NMR) spectroscopic devices, and more particularly to a small scale NMR spectroscopic apparatus, and a method of spectroscopy such as measurement of a patient's body fluid glucose levels.

Nuclear magnetic resonance (NMR) spectroscopy is an analytical and diagnostic technique that can be used for structural and quantitative analysis of a compound in a mixture. NMR is based on the nuclear magnetic properties of certain elements and isotopes of those elements. It is a fundamental law of quantum mechanics that nuclei with a nonzero spin will have a magnetic dipole and will thus interact with electromagnetic radiation. The presence or absence of a spin and the nature of the spin is expressed in terms of the spin quantum number (I) of the nucleus, which may be either 0, ½, or integer multiples of ½. The most important group analytically, because it includes $^1H$ present in many compounds of interest, has a nuclear spin quantum number of ½.

In a uniform magnetic field, a nucleus having a spin quantum number of ½ may assume two orientations relative to the applied magnetic field. The two orientations have different energies, so that it is possible to induce a nuclear transition, analogous to flipping a bar magnet in a magnetic field, by applying electromagnetic radiation of the appropriate frequency. This nuclear transition, known as resonance, is thus brought on when the correct combination of magnetic field strength and exciting frequency characteristic of the nuclei of interest are applied. After resonance is achieved, the NMR instrument detects a signal, the signal being a function of the nature and amount of a compound in the test sample as well as nuclear magnetic relaxation considerations. Because all nuclei have unique resonances, e.g. approximately 60 megahertz in a 14 kiloGause (1.4 Tesla) field for protons, $^1H$ NMR will only detect compounds having protons. Moreover, because the exact frequency at which a proton resonates within this range is related to its chemical environment, the $^1H$ NMR signal of protons of one compound can generally be distinguished from another, and the integrated intensity of the signal is directly proportional to the amount of the compound of interest. The position of the resonance signal is characterized by its frequency, i.e., the chemical shift, which is usually expressed on a ppm scale relative to the resonance frequency of some standard compound.

A NMR spectrometer generally comprises one or more magnets producing a strong homogenous magnetic field within a test region, a coil to apply the excitation frequency (the transmitter coil), a coil to generate a signal when the nuclei of the test sample resonate (the receiver coil), and a radiofrequency (RF) oscillator to supply A/C current through the transmitter coil. One coil may act as both the transmitter coil and receiver coil if the current is appropriately gated. A transition occurs in the test sample when the RF frequency applied matches the resonance frequency of the nuclei of the compound of interest.

The size and complexity of NMR spectrometers are largely a function of the magnetic field requirements. A typical NMR magnet used for analytical or chemical structural analysis purposes can weigh from a few hundred to as many as 500 kilograms. However, because the strength of the detected resonance signal is proportional to the magnetic field strength raised to the 3/2 power in the test region, it is very important to provide a magnet with the highest field possible as the magnet is scaled down in size. On the other hand, providing a strong magnetic field generally requires larger, higher weight magnets, which typically increases the cost of the spectrometer depending on the type and the weight of materials used. The most expensive, by far, is the permanent magnet material. Thus, the competing factors of spectrometer field strength and magnet cost must be balanced so that the desired signal strength and cost requirements are met. Moreover, the magnetic field produced must be stable and homogeneous within the test region. The magnetic field strength within the test region, and resulting magnet weight, is a function of a number of variables including the type of magnetic materials used, the extent of the suppression of leakage fields, the size of the test area between the magnets and the configuration of the field flux shaping and conducting components.

Diabetes is a disorder of metabolism characterized by lack of insulin effect. One of the pathologies of diabetes is the inability of glucose to enter the body's cells and be utilized. Due to the severe effects of excessively high or low blood glucose levels, insulin dependent diabetics should measure their blood glucose levels several times a day. However, the most widely used method requires obtaining a blood sample by finger pricking, which is painful and thus may often be neglected by the patient. $^1H$ NMR is a suitable technique for measuring a patient's glucose level. However, the in vivo $^1H$ NMR spectroscopic analysis of glucose is complicated by the intense signals generated by water and other compounds in the patient's blood and tissue. A hand held NMR device has been suggested for in vivo measurement of a patient's blood glucose levels in U.S. Pat. No. 4,875,486 (Rapoport et al.). However, the device described by Rapoport apparently has never been commercialized. It is believed that the device described could not effectively suppress the large signal of water in the body fluid as required for a clinically suitable device.

Therefore, what has been needed is a small NMR spectrometer and method which allows for the measurement of the concentration of a compound, such as glucose, in a patient. The present invention satisfies these and other needs.

SUMMARY OF THE INVENTION

The invention is directed to a relatively small, light weight NMR apparatus and a method for the spectroscopic analysis of a compound in a fluid, such as a patient's body fluid, and particularly the measuring of a patient's body fluid component, such as glucose, using a radiofrequency (RF) pulse sequence specific for the detection of such component. The term "body fluid" should be understood to include intracellular and extracellular fluids.

The NMR spectroscopic system of the invention includes a magnet assembly suitable for developing a strong uniform magnetic field across a test region and an RF emission system for the application of a variable exciting frequency normal to the uniform field. The magnet assembly generally comprises two permanent magnets facing one another so that the facing surfaces have opposite polarities, a pole cap tapering inwardly on each of the two facing surfaces of the permanent magnets, and a plurality of radially polarized canceling magnets disposed about the permanent magnets and pole caps. A test region and a coil are located in an air gap between the pole cap facing surfaces.

The permanent magnets are formed from high energy material such as neodymium-iron-boron alloy, so that relatively small, light weight magnets can be used which will generate a strong field in the test region. However, the same high energy magnetic potential generating the high magnetic field in the test region also will exist in all parts of the pole caps. This magnetic potential will, therefore, generate extraneous magnetic fields outside the test region that contribute nothing to the NMR signal. These extraneous fields are called leakage fields. If nothing is done to reduce these leakage fields, the size of the high energy permanent magnetic material must be increased to carry them or their effectiveness will be reduced resulting in reduced magnetic field strength. The principal unchecked leakage fields will form barrel shaped patterns from the sides of one pole cap to the other pole cap and lateral fan shaped patterns from both pole caps to the outer housing. Conventional methods of mitigating the effect of such leakage fields result in an extremely large, heavy, and expensive magnet assembly. In the magnet assembly of the invention, auxiliary magnets are added having strength, position and polarization designed to substantially cancel or reduce the principal leakage fields, thereby reducing the total magnetic flux in the circuit. These auxiliary magnets, referred to as canceling magnets, greatly reduce the leakage fields, to maintain the field strength in the test region without a disadvantageous increase in size, weight, and cost of the magnet assembly of the invention.

In addition there is a low reluctance ferromagnetic member, called a yoke, that conducts the field from the back of one of the permanent magnets, around the outside of the permanent magnet and pole piece array, and to the back of the opposite magnet. This forms an enclosed magnetic circuit and provides an extremely low magnetic resistance to flux flow around the magnetic circuit. This normal design feature reduces the magnetic potential required to achieve the proper field in the test region, allowing reduction in the size of the permanent magnets. However, the canceling magnets of the invention allow the radial distance between the yoke and the permanent magnet to be decreased without increasing the leakage flux. The size of the yoke, permanent magnets, and pole caps can be reduced in proportion to the reduction in the leakage fields and, in addition, the yoke can be reduced by the reduction in spacing. Therefore, the canceling magnets of the invention allow the size of the yoke, permanent magnets and pole caps to be decreased substantially. The magnet assembly is provided with a narrow air gap between the opposing permanent magnets/pole caps of approximately 2 cm, and more specifically about 1.9 cm. The leakage ratio, which is the ratio of the field produced to the field directed to the air gap, is a measure of the effectiveness of a magnet assembly at canceling out the leakage fields. The design of these canceling magnets reduces the leakage ration from about 5:1 to better than 2.5:1.

Because the field homogeneity is directly proportional to the ratio of the size of the pole cap face to the air gap width, the small air gap improves the field homogeneity. The face diameter of the pole cap in the invention is reduced, without sacrificing homogeneity in the test region, by providing a raised portion around the tapered pole cap face called a tapered ring shim. The field inhomogeneities normally associated with a smaller pole cap face to gap ratio is reversed by increasing the field further from the center by decreasing the gap in the outer region with the ring shim. To prevent inhomogeneities due to variations in magnetic saturation in the ring shim structure, the corners of the tapered ring shim are curved to reduce the magnetic flux density concentration normally encountered with sharp corners, so that the field is well below saturation. Spatial variations in saturation induction values through the volume in ferromagnetic materials are well known to occur due to differences in processing the raw material and fabricating the parts.

The method of the invention provides for measurement of the concentration of a constituent, such as glucose, in a fluid, such as a patient's body fluid, using NMR spectroscopy. The method comprises spectral editing in which a RF pulse sequence is used. The RF pulse sequence combines double quantum filtration and glucose specific signal detection to reduce the water signal and selectively stimulate only the desired resonances of glucose, and thereby facilitate resolution of the glucose signal. Unlike methods in which the proton resonances of all the constituents in the sample are obtained, spectral editing minimizes the problem of distinguishing the glucose signal from resonances of other components in the patient's blood. Pulse sequences for spectral editing rely on the design of RF pulses to elicit specific nuclear spin system behavior. While pulse sequences used for the spectral editing of different compounds may share common features, the appropriate sequence of RF pulses for a given compound of interest must be individually assembled. Thus the pulses for a given compound have a unique center frequency, range of frequencies, and phase, and are separated by precisely timed intervals. A pulse sequence repeated one or more times, known as a pulse sequence scan, improves the signal to noise of the test sample signal.

The pulse sequence of the invention is specific for resonances of glucose protons which are scalar coupled, i.e., nuclei having a through-bond magnetic interaction. Specifically, the RF pulses selectively excite the glucose protons at about 5.4 ppm and a scalar coupled partner of the protons at about 3.6 ppm, although other suitable scalar coupled pairs in glucose may be used alone or in addition to this pair. Thus, because the pulse sequence of the invention irradiates only these coupled resonances of glucose and no others, the overwhelming signals of the protons of water and other components in the blood are greatly minimized or suppressed, and are generally not detected.

In one aspect of the invention, in vivo measurement is made on a patient's body fluid. When the specific pulse sequence is used in combination with the NMR apparatus of the invention, an effective, accurate, and relatively small lightweight apparatus is provided with which patients can noninvasively measure their body fluid glucose levels at home or elsewhere at their convenience. The measurement is made on a part of the patient, such as a finger. Because the patient's finger is composed of several tissues, e.g., skin, fat, tendon, muscle, bone, and blood, the glucose signal is from the body fluid of the totality of such tissues, which signal is related to the patient's blood glucose level.

The invention allows for substantial size and cost reductions in the magnet assembly for NMR spectroscopy. The pulse sequence of the invention selectively detects the desired resonances in glucose, to allow for accurate quantitative measurement of the glucose level in the complex mixture of a patient's body fluid. The NMR apparatus and method of the invention is therefore extremely useful to diabetics. These and other advantages of the invention will become more apparent from the following detailed description and exemplary figures.

DETAILED DESCRIPTION OF THE INVENTION

Figure 1:
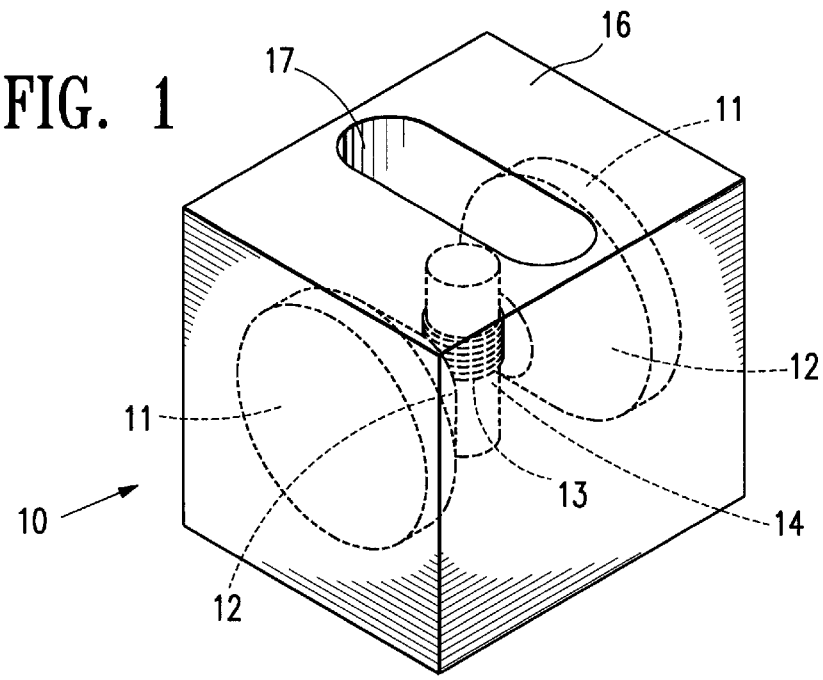
FIG. 1 is an elevational view of the NMR device of the invention showing the magnet assembly and coil partially in phantom.
Figure 2:
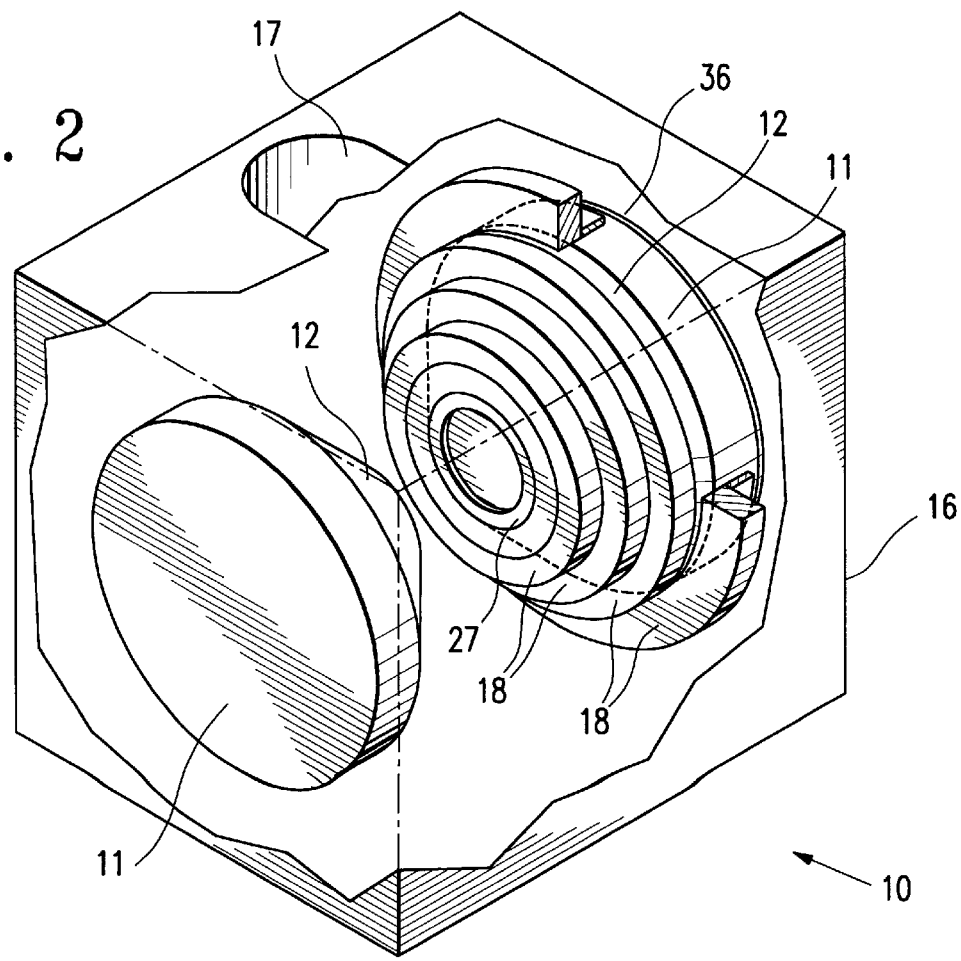
FIG. 2 is an elevational view partially in section of a magnet assembly of the invention.

FIGS. 1 and 2 illustrate the NMR magnet assembly 10 of the invention, which generally includes a pair of opposed permanent magnets 11, and a pair of opposed pole cap members 12 which are adjacent to the permanent magnets and which define, with a coil 13, a test region 14. The pole cap members radially taper inwardly toward the test region. A housing 16 surrounds and supports the magnets and pole cap members, and has a port 17 providing the patient access to the test region 14 between the pole cap members. As best illustrated in FIG. 2, the magnet assembly 10 also includes a plurality of annular canceling magnets 18 disposed about the permanent magnets 11 and pole cap members 12. A measurement is made when the patient inserts at least a part of his or her body, such as a hand, into the device through the port 17 in the housing 16, so that one of the patient's fingers is at least partially placed in the test region 14. The port is sized to accommodate a human hand and is about 3.8 cm to about 4.2 cm wide and about 8.4 cm to about 12.7 cm in length.

Figure 3:
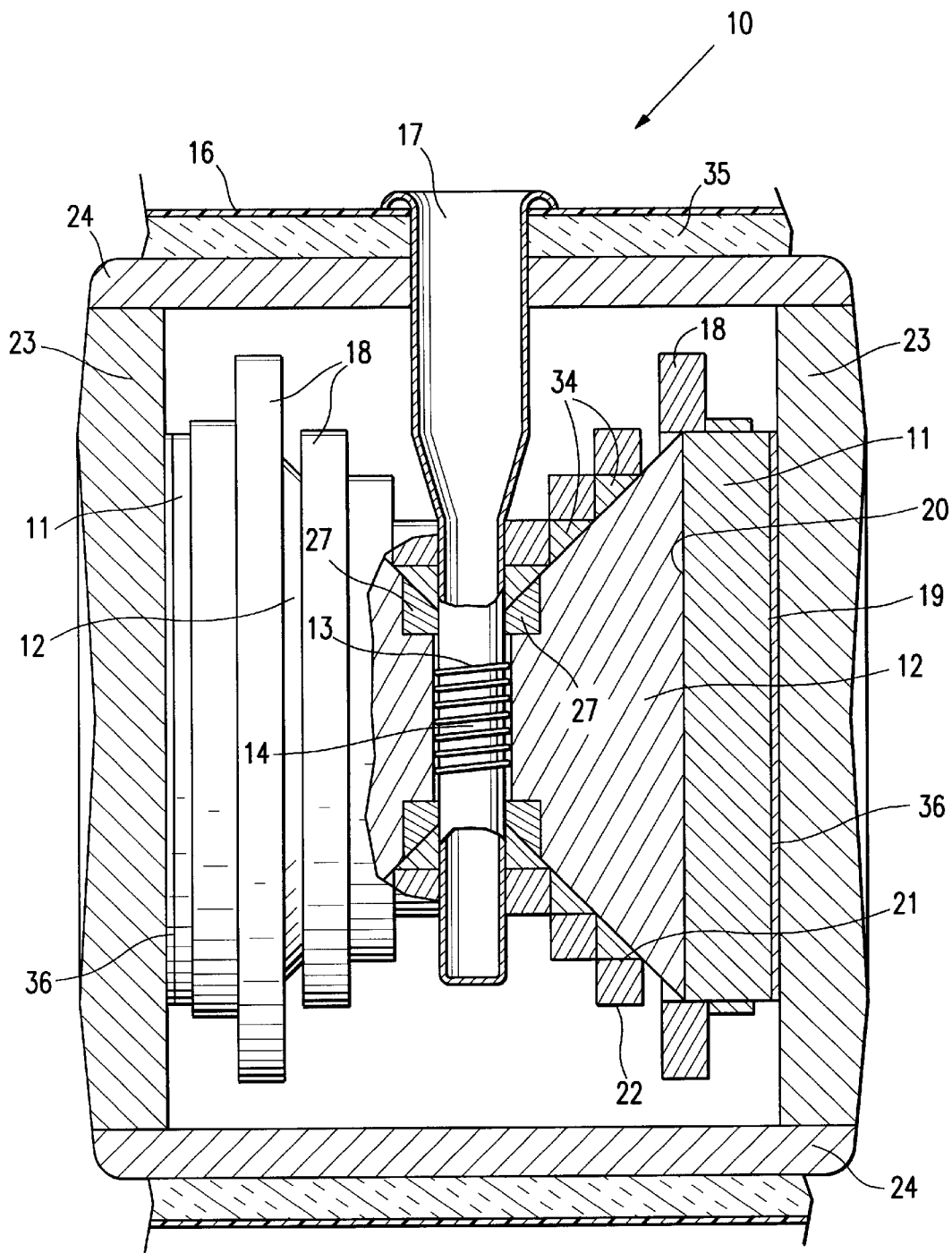
FIG. 3 is a cross sectional view of the magnet assembly of the invention.

FIG. 3 illustrates a transverse cross section of the magnet assembly 10. Each magnet 11 has a back surface 1 9, and a front surface 20. The front surface 20 faces the opposing permanent magnet front surface, and the facing front surfaces 20 have opposite polarities. Each pole cap has a back surface adjacent the front surface of one of the permanent magnets 11 and a front surface facing the opposing pole cap front surface. Each canceling magnet 18 has an inner surface 21 and an outer surface 22. The canceling magnets 18 are radially polarized, so that one magnetic pole is on the inner surface 21 and the other magnetic pole is on the outer surface 22 of the canceling magnets. The polarization of these magnets is such that the inner polarity is the same as the front surface of the pole cap member and the outer polarity is the opposite.

Yoke members 23 are connected by outer shell members 24 which extend the length of the magnet assembly. The pair of yoke members 23 are adjacent to and extend beyond the back surface of each permanent magnet 11. In the embodiment illustrated in FIG. 3, the yoke members 23 are tapered toward a central axis of the magnet assembly from a diameter approximating the outside diameter of the permanent magnets, and also taper toward the outside surface of the shell members to reduce the weight of the assembly.

Figure 5:
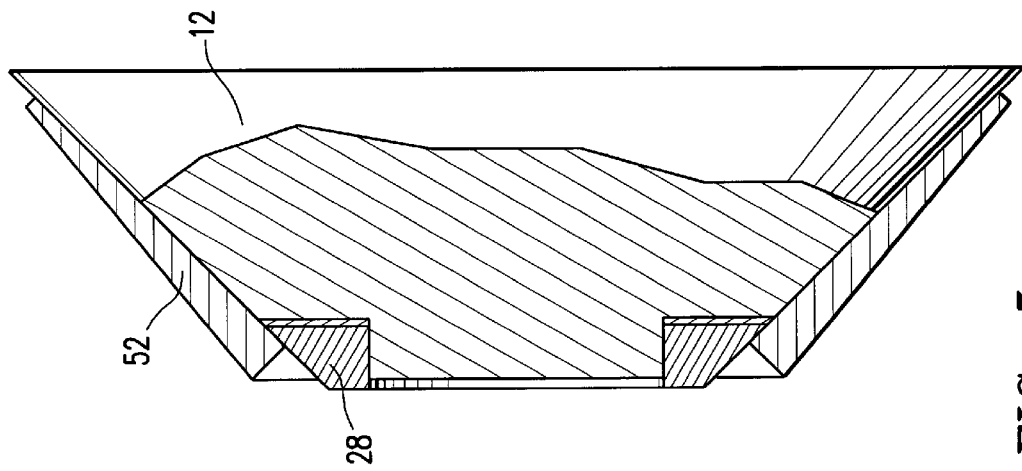
FIG. 5 is a cross sectional view of the pole cap member and an alternative embodiment of the canceling magnets of the invention having a thickness increasing from the back surface to the front surface.
Figure 4:
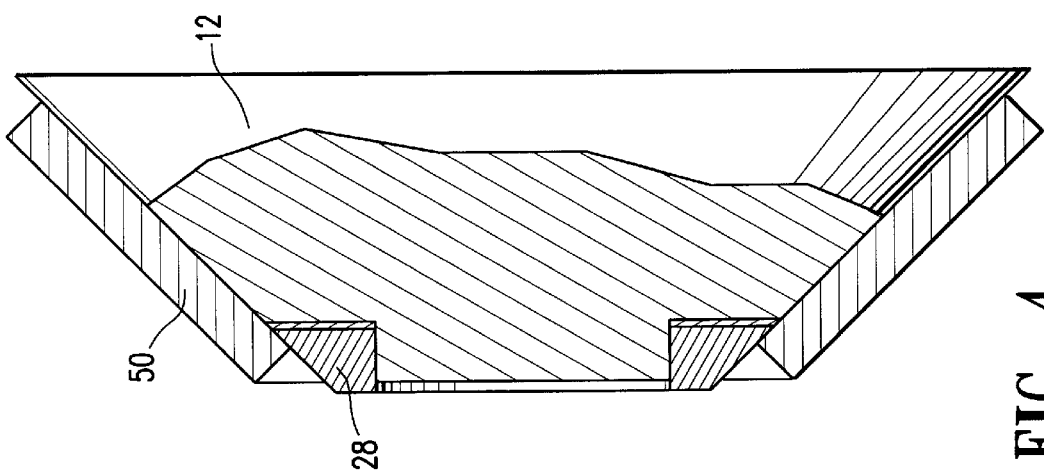
FIG. 4 is a cross sectional view of the pole cap member and an alternative embodiment of the canceling magnets of the invention having an inner surface adjacent to the tapered surface of the pole cap member.

Lateral leakage fields radiate from the pole cap members to the yoke 23 and shell 24 members. The radially polarized canceling magnets provide an equal and opposite magnetic potential on the leakage fields to thereby reduce or cancel this leakage flux. The canceling magnets are strategically placed about the pole caps and permanent magnets. In a presently preferred embodiment, at least three ring canceling magnets are disposed about each pole cap, and at least one canceling magnet is disposed at least in part about each permanent magnet In the embodiment illustrated in FIG. 3, the canceling magnets 18 are placed with magnetization at right angles to the pole cap member axis. In the embodiment illustrated in FIG. 4, the canceling magnet 50 has an inner surface configured to match the taper of the pole cap member 12 side, and magnetization at right angles to the sides of the pole cap members, for increased efficiency in reducing the leakage fields. The canceling magnet 50 may comprise segmented members. In the embodiment shown in FIG. 3, the annular canceling magnets 18 disposed about the pole cap members 12 have a uniform square cross section, although other shapes may be suitable. In contrast, the canceling magnets disposed about the permanent magnet 11 and about the junction of the permanent magnet 11 and the pole cap 12 have a large dimension and a small dimension, e.g. have a rectangular cross section. In an alternative embodiment illustrated in FIG. 5, the canceling magnet 52 increasing inwardly toward the front surface of the pole cap member. The canceling magnets are secured about the pole caps and permanent magnets by a variety of suitable securing means, see for example securing member 34, in FIG. 3 including by bonding or snap fitting into holders.

In a presently preferred embodiment the canceling magnets are formed from Nd—Fe—B alloy. However, a variety of suitable magnetic materials exist for the canceling magnets, including but not limited to other rare earth alloys such as samarium-cobalt alloy (Sm—Co). The canceling magnet 18 adjacent to the front surface of the pole cap member has an inner diameter configured to fit around the pole cap member of about 70 mm to about 75 mm, and preferably about 73 mm. The canceling magnet 18 adjacent to the back surface of the pole cap member is about 145 mm to about 155 mm, and preferably about 151 mm. The length of the canceling magnets measured along the inner diameter surface is about 50 to about 60 mm, and preferably about 55 mm. In the embodiment illustrated in FIGS. 3 and 4, the thickness of the canceling magnet 18/50 is about 6.5 mm to about 9.0 mm, and preferably about 6.7 mm to about 7.3 mm. In the embodiment illustrated in FIG. 5, canceling magnets 52 have a large dimension thickness of about 7.0 mm to about 10 mm, and preferably about 8.8 mm to about 9.6 mm. The canceling magnet 18 shown in FIG. 3 disposed about the permanent magnet 11, has an inner diameter of about 160 mm to about 170 mm, and preferably about 162 mm to about 167 mm, and an outer diameter of about 165 mm to about 180 mm, and preferably about 169 mm to about 174 mm, and a width of about 10 mm to about 17 mm, and preferably about 13 mm to about 15 mm. The canceling magnet 18 disposed about the junction of the permanent magnet 11 and the pole cap 12 has an inner diameter of about 160 mm to about 170 mm, and preferably about 162 mm to about 167 mm, and an outer diameter of about 200 mm to about 210 mm, and preferably about 204 mm to about 208 mm, and a width of about 10 mm to about 16 mm, and preferably about 12 mm to about 14 mm.

Figure 10:
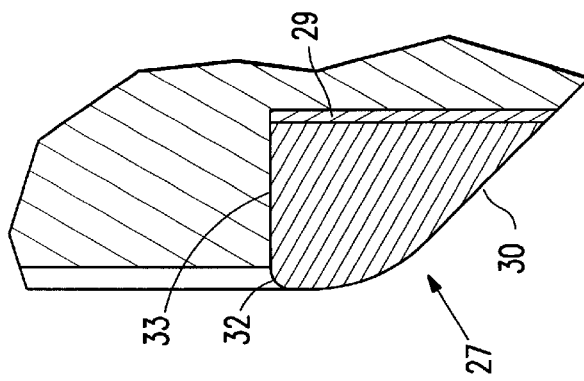
FIG. 10 is a cross sectional view of a ring shim having a front surface with a curved inner corner.
Figure 9:
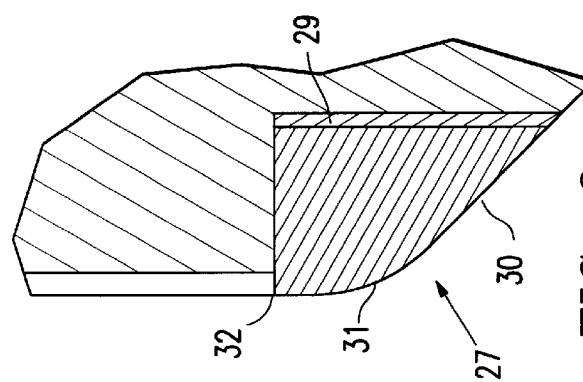
FIG. 9 is a cross sectional view of a ring shim having a front 10 surface with a curved outer corner.
Figure 8:
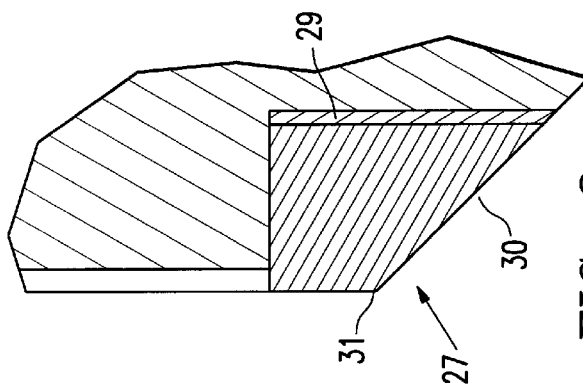
FIG. 8 is an enlarged view of the ring shim, shown in FIG. 6 within circle 8, having a front surface with a squared edge outer corner.
Figure 7:
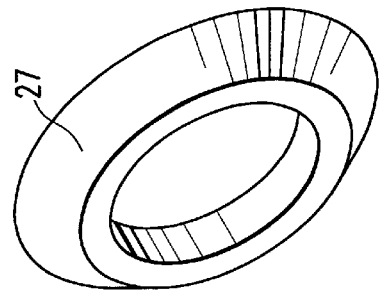
FIG. 7 is an elevational view of the ring shim of the invention.
Figure 6:
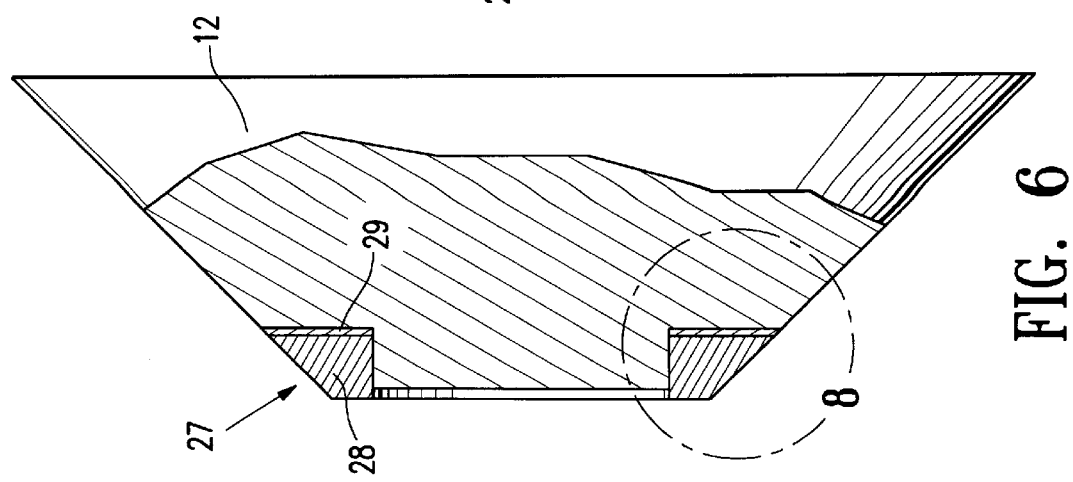
FIG. 6 is a cross sectional view of the pole cap member and ring shim of the invention.

In one aspect of the invention, an annular ring shim 27 is provided on a peripheral portion of the front surface of the pole cap member. As best illustrated in FIG. 6, the ring shim 27 comprises a ring 28 and a spacer 29, and is disposed in a groove in the pole cap member front surface. The thickness of the spacer 29 is adjusted to optimize the field homogeneity in the test region by adjusting the height that the front surface of the ring 28 beyond the pole cap member 12. This optimum thickness varies somewhat from lot to lot of pole cap material and is determined by testing on an electromagnet. During manufacture, the ring 28 is first mounted on the pole cap member 12 without the spacer 29 and the subassembly is machined as though it were a single piece. The ring 28 is then removed and the appropriate precision spacer shim 29 is installed replacing the ring 28 in the same orientation as machined. FIG. 7 illustrates an elevational view of the ring 28, and FIG. 8 illustrates an enlarged view of the area in circle 8 of FIG. 6. In the embodiment illustrated in FIG. 7, the ring shim 27 outer side 30 is tapered, although other suitable shapes exist, including a rectangular cross section. In the embodiment illustrated in FIG. 8, the front surface outer corner 31 between the outer pole cap taper 30 and the front surface is square edged. In a presently preferred embodiment illustrated in FIG. 9, the front surface outer corner 31 is curved, so that magnetic field homogeneity in the test region is increased. The curved edge reduces the magnetic field in the pole cap peripheral edge thereby allowing the magnet to operate at an increased strength of the field without saturation. The field concentration in a sharp edge in this edge location will cause magnetic saturation at the fields needed to operate the magnet of this invention. Variations in the saturation induction around the periphery would cause uncorrectable errors in homogeneity, if the rings were allowed to saturate in any portion. In another embodiment illustrated in FIG. 10, the front surface inner corner 32 of the ring shim, adjacent the ring shim inner side 33, is curved for the same purpose.

The permanent magnet is formed from a high magnetic energy material. Suitable materials have an energy product of at least 38 Megagauss-Oersteds and include but are not limited to materials formed at least in part from rare earth elements. In a presently preferred embodiment, the permanent magnet 11 is formed from neodymium-iron-boron (Nd—Fe—B) alloy. In the embodiment shown in FIG. 1, the permanent magnet 11 is a puck shaped magnet with a circular cross section. The permanent magnet 11, formed of Nd—Fe—B, has a diameter of about 15.5 cm to about 17 cm, and typically about 16.0 cm to about 16.4 cm, and a width of about 2 cm to about 3 cm, and typically about 2.4 cm to about 2.6 cm. The weight of each permanent magnet is about 3.8 kg to about 3.9 kg. The pole cap member 12 has a circular cross section and tapered sides which taper to a smaller diameter from the pole cap back surface to the front surface. The circular back surface of the pole cap is sized to be substantially equal to the diameter of the permanent magnet 11. The diameter of the front surface of the pole cap is from about 6.0 cm to about 6.5 cm. A presently preferred pole cap is formed from high purity iron, although other suitable materials exist including but not limited to and iron-cobalt alloy.

In the embodiment illustrated in FIG. 3, a back plate 36 is disposed between the back surface 19 of the permanent magnet 11 and the yoke member 23, to reduce the leakage fields to the yoke member. The back plate is preferably the same iron material as the yoke although other suitable ferromagnetic materials exist. The back plate is preferably taper shaped with a circular cross section similar to the pole cap but smaller. In a presently preferred embodiment, the outer edge of the back plate is tapered so that the diameter of the front surface is greater than the diameter of the back surface. The back plate has a thickness of about 0.2 cm to about 0.5 cm, at a diameter substantially equal to the permanent magnet diameter.

The presently preferred yoke members 23 have a thickness of about 1.4 cm to about 2.0 cm. The shell members 24 are preferably made of the same iron material as the yoke and have a thickness of about 1.4 to 1.6 cm. The housing 16 is formed from plastic and has a thickness of about 0.2 cm to about 0.5 cm. Thermal insulation 35 is provided around outside of magnet assembly 10 inside the housing 16, and has a thickness of about 1.5 cm to about 3.0 cm, and typically about 2.0 cm. In contrast to the magnet assembly 10 of the invention, conventional methods of mitigating the magnet leakage fields involve increasing the iron in the yoke members, increasing the thickness of the housing by a factor of six to eight that which would be necessary to carry the pole cap fields alone, and increasing the radial distance between the pole caps and housing, which results in an extremely large, heavy, and expensive magnet assembly.

Figure 11:
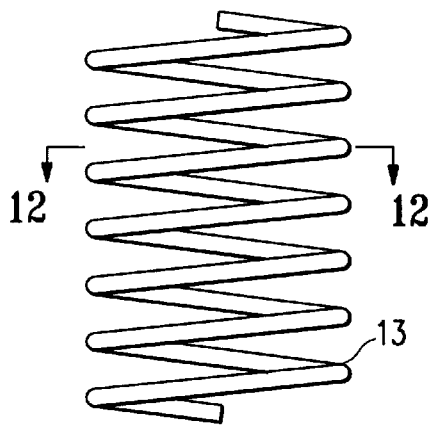
FIG. 11 is an elevational view of a coil.
Figure 12:
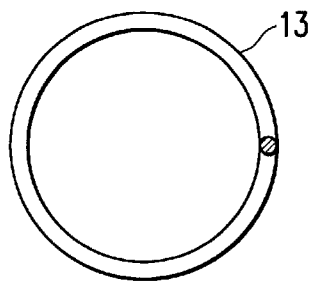
FIG. 12 is a cross sectional view of the coil shown in FIG. 11 taken along lines 12—12.

As illustrated in FIG. 3, coil 13 used to transmit RF energy and receive the sample signal is provided in the air gap between the pole cap members 12. In a presently preferred embodiment, best illustrated in FIGS. 11 and 12, the coil is a solenoid type coil having a tubular configuration which at least in part defines the test region 14. The coil has a length of about 1 cm to about 5 cm. The coil has an outer diameter of about 1.6 cm to about 2 cm, and an inner diameter of about 1.5 cm to about 1.8 cm. One skilled in the art will recognize that many suitable coil configurations may be used, including saddle coils.

Figure 13:
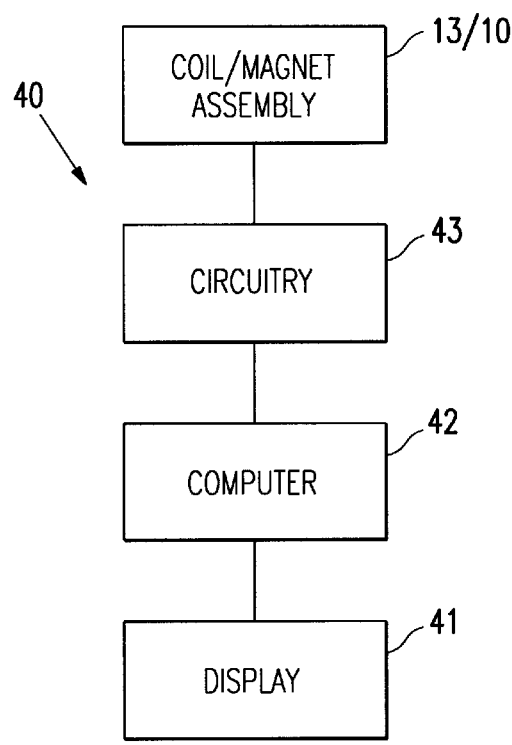
FIG. 13 is a block diagram of the NMR apparatus of the invention.
Figure 14:
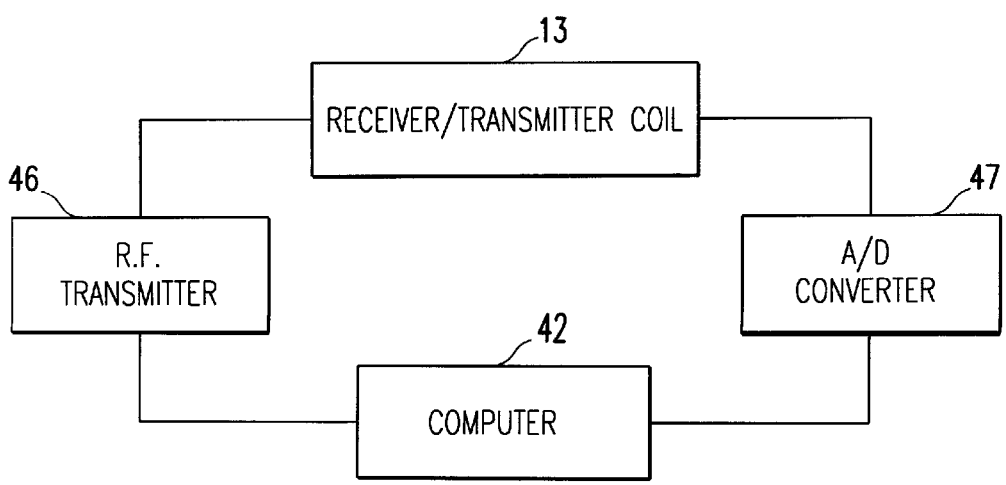
FIG. 14 is a block diagram of the circuitry of the NMR apparatus of the invention.

FIG. 13 illustrates a block diagram of the NMR apparatus 40 of the invention, which generally comprises a display 41, a computer 42, circuitry 43, coil 13, and magnet assembly 10. As best shown in FIG. 14, the circuitry includes an RF transmitter 46 connected to the computer 42 and the coil 13, for generating the RF excitation frequency in the coil. An analog to digital (A/D) converter 47 is connected to the computer and coil for converting the sample signal received by the coil. The current entering and exiting the coil is gated to allow a single coil to function as both the transmitter and receiver coil.

The magnet assembly 10 of the invention has a square cross section of from about 25 cm to about 50 cm, and typically about 30 cm to about 31 cm, and a length of about 20 cm to about 40 cm, and typically about 24 cm to about 25 cm. The magnet assembly 10 weighs from about 59 kg to about 62 kg. A magnetic field strength of about 14.1 kG (1.4 T) is generated in the test region.

Figure 15:
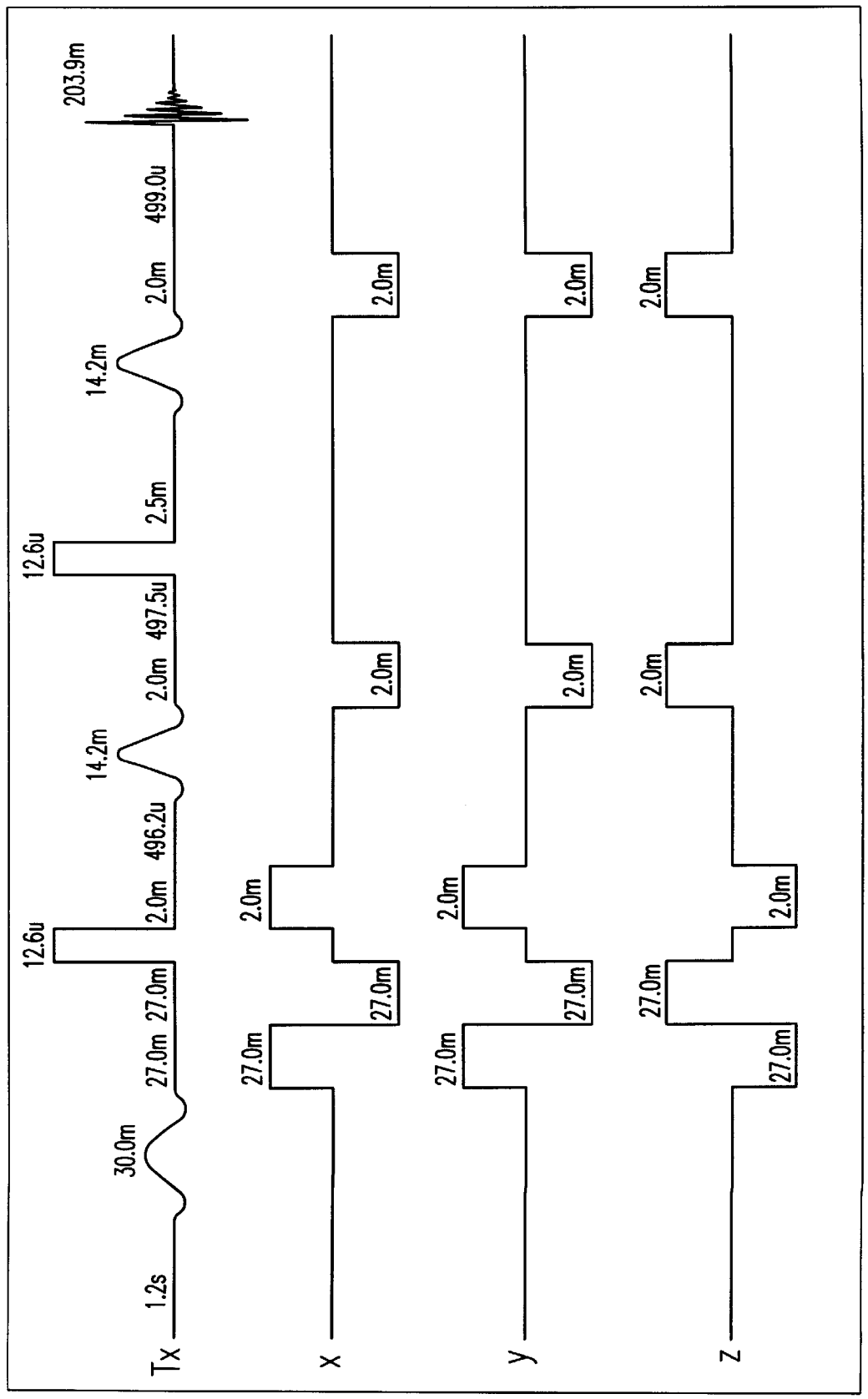
FIG. 15 is a graphical illustration of an RF pulse sequence of the invention

Another aspect of the invention involves a method of measuring the glucose concentration in a patient's body fluid using spectral edited NMR spectroscopy involving a plurality of RF pulse separated by precisely times intervals. In the method of the invention, a NMR pulse sequence is applied at least once such that specific scalar coupled resonances of glucose are detected. In a presently preferred embodiment of the invention, the pulse sequence comprises the sequence illustrated in FIG. 15. The pulse sequence illustrated in FIG. 15 can be expressed as follows:

$$90°_{select\ I;\phi1}-\tau-90°_{All;\phi2}-G_1-180°_{select\ I,S;\phi2}-G_2-90°_{All;\phi3}-\Delta-$$
$$180°_{select\ I,S;\phi3}-G_3-\Delta'-\text{Acquisition}_{\phi R}$$

which indicates the pulse degree (90° or 180°), delay time after a pulse ($\tau$ and $\Delta$), and phase cycle scheme ($\phi$). I and S are arbitrary designations for the two protons of the glucose molecule which are of interest in the pulse sequence measurement. $G_1$, $G_2$, and $G_3$ represent pulsed field gradients, i.e., current pulses resulting in an instantaneous field change in the homogeneity along the Z axis. Thus, the $90°_{select\ I;\phi1}$ notation denotes an RF pulse of flip angle 90°, applied on the I spin with the RF phase cycled according to scheme $\phi1$ and the $180°_{select\ I,S}$ notation denotes a 180° RF pulse applied on the I and S spins. The $90°_{All}$ notation denotes a 90° RF pulse applied on all spins. In FIG. 15, the channel being observed (proton) is shown above the gradient channels for phases x, y, and z, which depict the direction of the gradient pulses.

In the method of the invention using the pulse sequence illustrated in FIG. 15, the pulse sequence involves the application on spin I of a selective 90° pulse of 30.0 msec which creates transverse magnetization on the selected I spin, which evolves under the $J_{is}$ spin-spin coupling, and becomes antiphase with respect to spin S during the delay $\tau$. The delay $\tau$ is depicted in FIG. 15 as two consecutive 27.0 msec delays, corresponding to two pulsed field gradients in opposite directions, to enhance the reduction of the water signal. The anti-phase magnetization is converted into double quantum magnetization by the $90°_{All}$ pulse, of 12.6 $\mu$sec. A pulsed field gradient pulse, $G_1$, of 2.0 msec follows the $90°_{All}$ pulse and, together with the $G_2$ pulse of similar duration encodes the phase of the double quantum magnetization with respect to the double quantum coherence order. As shown in FIG. 15, a delay of 496.2 $\mu$sec follows the $G_1$ gradient to allow the effect of the gradient to decrease. A similar recovery delay of 497.5 $\mu$sec follows $G_2$. A $180°_{select\ I,S}$ pulse is applied between $G_1$ and $G_2$ to ensure that only the I-S doublet quantum magnetization will be refocused later by the gradient $G_3$. Following the $G_2$ gradient, a $90°_{All}$ pulse, of 12.6 $\mu$sec is applied to convert the double quantum magnetization into transverse magnetization. A $180°_{select\ I,S}$ pulse of 14.2 msec is applied, preceded by a delay, $\Delta$, of 2.5 msec. After the $180°_{select\ I,S}$ pulse, a gradient, $G_3$, of 2.0 msec is applied, followed by recovery delay, $\Delta'$, of 499 $\mu$sec. The chemical shift precession during the delays $\Delta$ and $\Delta'$ is refocused by the $180°_{select\ I,S}$ pulse. The acquisition time is 203.9 msec. The amplitude of gradients $G_1$, $G_2$, and $G_3$ are computed using standard calculations, so that the relative integrals (amplitude times duration) of the three are such that only the double quantum signals from I-S spins are effectively refocused during the acquisition time.

In a presently preferred embodiment of the pulse sequence illustrated in FIG. 15, the $90°_{select\ I,S}$ pulse has the shape of an E-BURP pulse, and the $180°_{select\ I,S}$ pulses have the shape of an I-BURP pulse (i.e., Excitation-Band Selective, Uniform Response, Pure-Phase and Inversion-Band Selective, Uniform Response, Pure-Phase, respectively (J. Magnetic Resonance, Vol. 93, pages 93–141, 1991)). One skilled in the art will recognize that other suitable shapes may be used.

The frequency of the applied RF irradiation is dependent on the frequency of the resonances of interest and the delay times. The delay $\tau$ is chosen to equal $[2J_{HH}]^{-1}$. For each RF pulse and delay time in the pulse sequence, one skilled in the art will recognize that a range of RF frequency values and time values exists around the optimum values given. However, departure from the optimum values quickly results in suboptimal spectral editing in terms of signal intensity or possibly in detection of unwanted resonances.

The phase cycle scheme, i.e., the phase shift of an RF pulse, improves the selection of double quantum signals while suppressing the other signals. In general, a plurality of phase cycle schemes may be used to achieve the same results. The presently preferred RF phase cycle scheme, with the phase shift of a pulse given in degrees, is as follows:

|  | $\phi1$ | $\phi2$ | $\phi3$ | $\phi R$ |
| --- | --- | --- | --- | --- |
| SCAN 1 | 90 | 0 | 90 | 0 |
| 2 | 90 | 0 | 180 | 270 |
| 3 | 90 | 0 | 270 | 180 |
| 4 | 90 | 0 | 0 | 90 |
| 5 | 0 | 90 | 180 | 270 |
| 6 | 0 | 90 | 270 | 180 |
| 7 | 0 | 90 | 0 | 90 |
| 8 | 0 | 90 | 90 | 0 |

One skilled in the art will recognize that other suitable phase cycle schemes may be used. Similarly, many suitable combinations of relative pulsed phase gradient integrals may be used to achieve double quantum selection.

Figure 16:
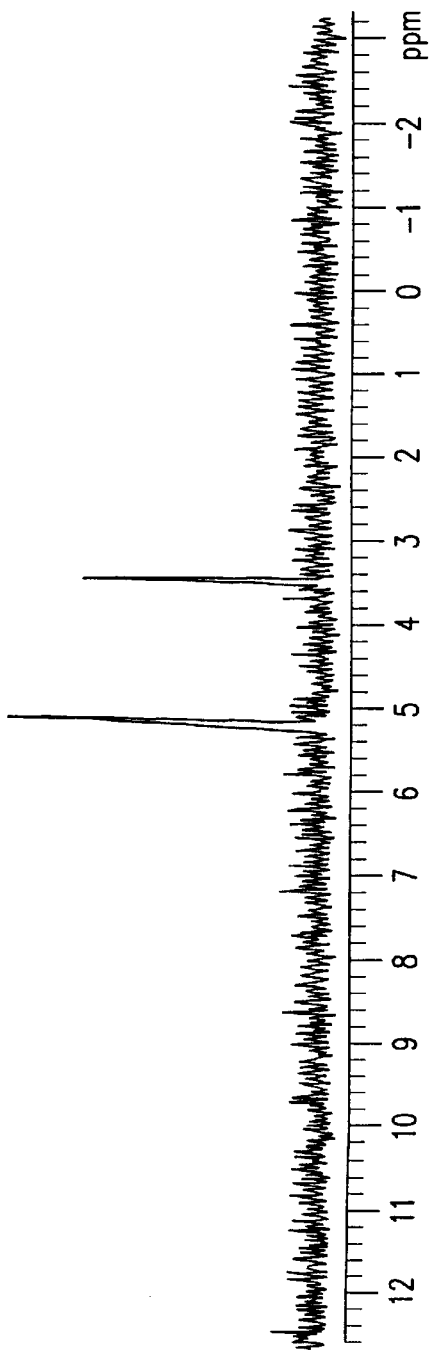
FIG. 16 is a NMR spectrum of a glucose test sample produced using the pulse sequence illustrated in FIG. 15.
Figure 17:
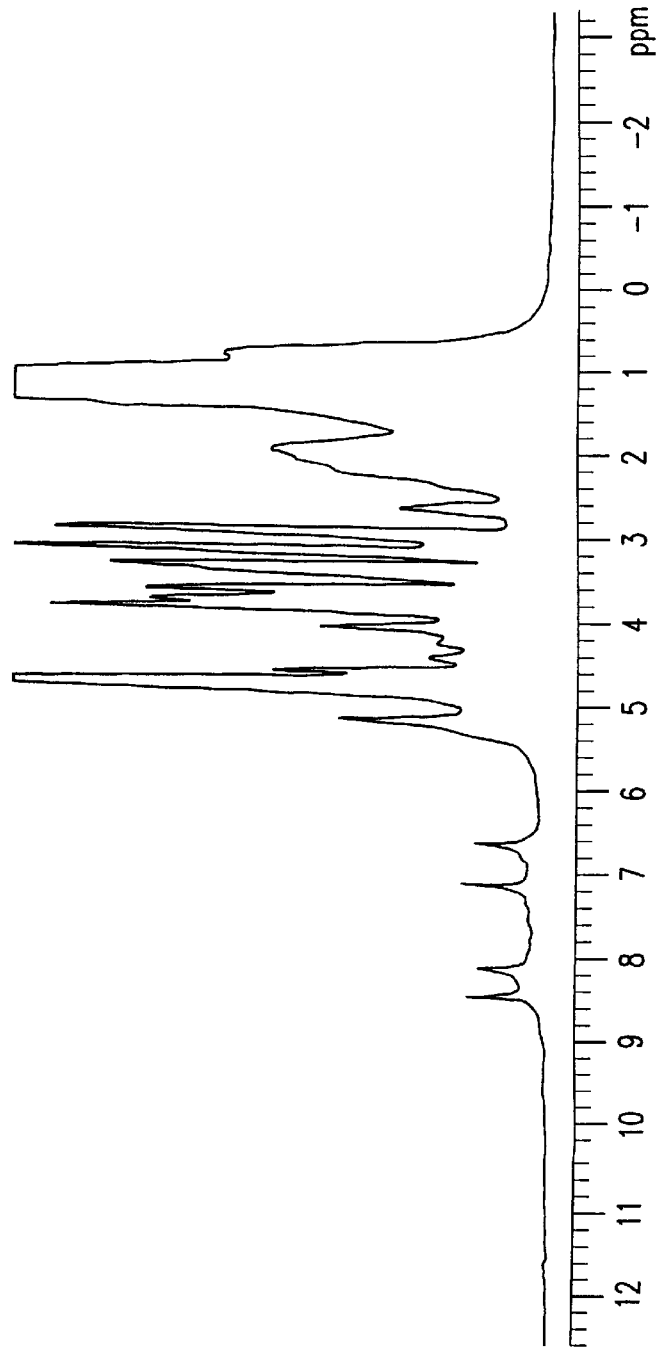
FIG. 17 is a NMR spectrum of a glucose test sample produced using a standard presaturation experiment.

The pulse sequence of the invention illustrated in FIG. 15 was applied to glucose samples, and used to detect the presence of glucose therein. A heterogeneous mixture of animal tissue and glucose solution in water was prepared, and the pulse sequence illustrated in FIG. 15 was applied to the sample. The pulse sequence detects only a selected pair of glucose resonances, as illustrated in the resulting NMR spectrum shown in FIG. 16. The glucose proton anomeric peak at about 5.4 ppm and its coupled partner at about 3.6 ppm are readily identified in the trace shown in FIG. 16. FIG. 17 illustrates the NMR spectrum obtained from a simple proton presaturation experiment on the test sample, in which other resonances interfere with resolution of the glucose signal.

Figure 18:
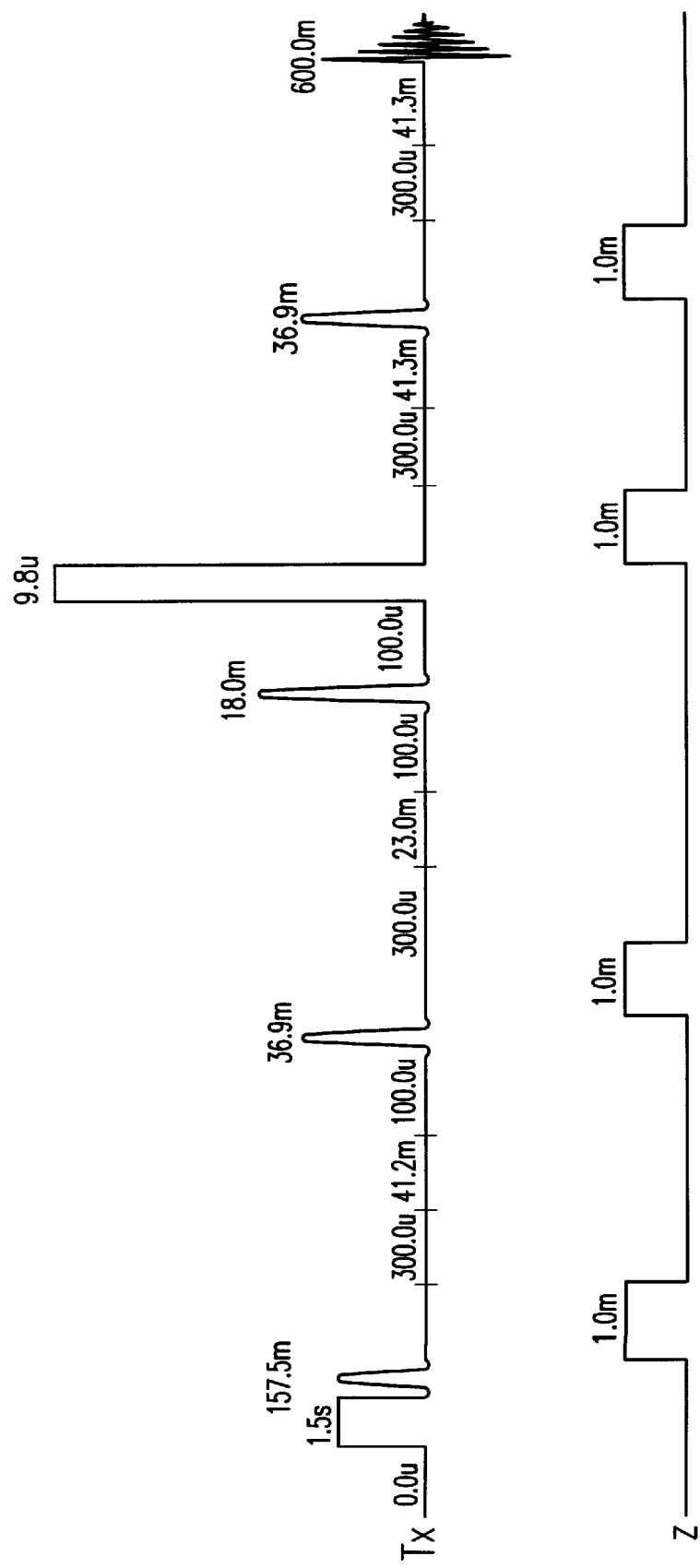
FIG. 18 is a graphical illustration of an alternative embodiment of the RF pulse sequence of the invention.

Another embodiment of the invention comprises the pulse sequence shown in FIG. 18. The pulse sequence illustrated in FIG. 18, like the pulse sequence shown in FIG. 15, involves detection of specific scalar coupled resonances of glucose, but does not involve double quantum filtration. The pulse sequence illustrated in FIG. 18 can be expressed as follows:

$$(\text{presaturate H}_2\text{O})-90°(X)_I-G_1-\tau-180°(X)_{I,S}-G_1-$$
$$\tau-90°(-X)_{Select\ H2O}\ 90°(X)_{All}-$$
$$G_2-\Delta-180°(X)_{I,S}-G_2-\Delta-\text{Acquisition}$$

where X indicates the phase of the RF pulse (X axis), i.e. the direction of the oscillating RF magnetic field vector. The $90°(-X)_{Select\ H2O}$ notation denotes a frequency selective pulse applied on the water signal with a phase of –X. The glucose proton resonance at about 3.6 ppm is scalar coupled to the resonance occurring at about 5.4 ppm. In the pulse sequence of the invention, only these resonances are irradiated, with detection of the resonance at 3.6 ppm.

In the method of the invention using the pulse sequence illustrated in FIG. 18, the pulse sequence involves the application on spin I of a soft 90° E-BURP pulse (i.e., Excitation-Band Selective, Uniform Response, Pure-Phase (J. Magnetic Resonance, Vol. 93, pages 93–141, 1991)) of 157.5 msec, followed by a delay of 41.2 msec. This initial 90° E-BURP pulse excites the anomeric proton magnetization at 5.4 ppm. Then two simultaneous soft Gaussian 180° pulses of 36.9 msec are applied to selectively excite protons at about 5.4 ppm on spin I and a scalar coupled partner of the protons at about 3.65 ppm on spin S, followed by a delay of 23 msec. Next, a 90° hard pulse, e.g. a short, nonselective pulse of a broad range of frequencies, of 9.8 $\mu$sec is applied, which causes magnetization transfer from the proton at 5.4 ppm to the proton at 3.6 ppm, and is followed by a delay of 41.3 msec. Phase cycling ensures that signals arising from nonmagnetization transfer sources are suppressed. Two simultaneous soft Gaussian 180° pulses of 36.9 msec are then applied to refocus the antiphase components. The 3.6 ppm proton resonance of glucose is detected by acquisition of the free induction decay (FID) for spin S, said acquisition being delayed by about 41.6 msec, so that antiphase components precess into phase. Additional water suppression can be obtained by applying a 90° selective (i.e. soft) pulse of 18 msec at 60 dB, which excites only water with z-component magnetization, before the 9.8 $\mu$sec 90° hard pulse. Additionally, the water suppression and rejection of other non glucose peaks can be enhanced by 1 msec gradient pulses of strength 9.4 and 6.6 Gauss/cm. The delay times are chosen to equal $[2J_{HH}]^{-1}$ and/or $[4J_{HH}]^{-1}$, although as discussed above for each RF pulse and delay time in the pulse sequence, one skilled in the art will recognize that a range of RF frequency values and time values exists around the optimum values given.

Figure 19:
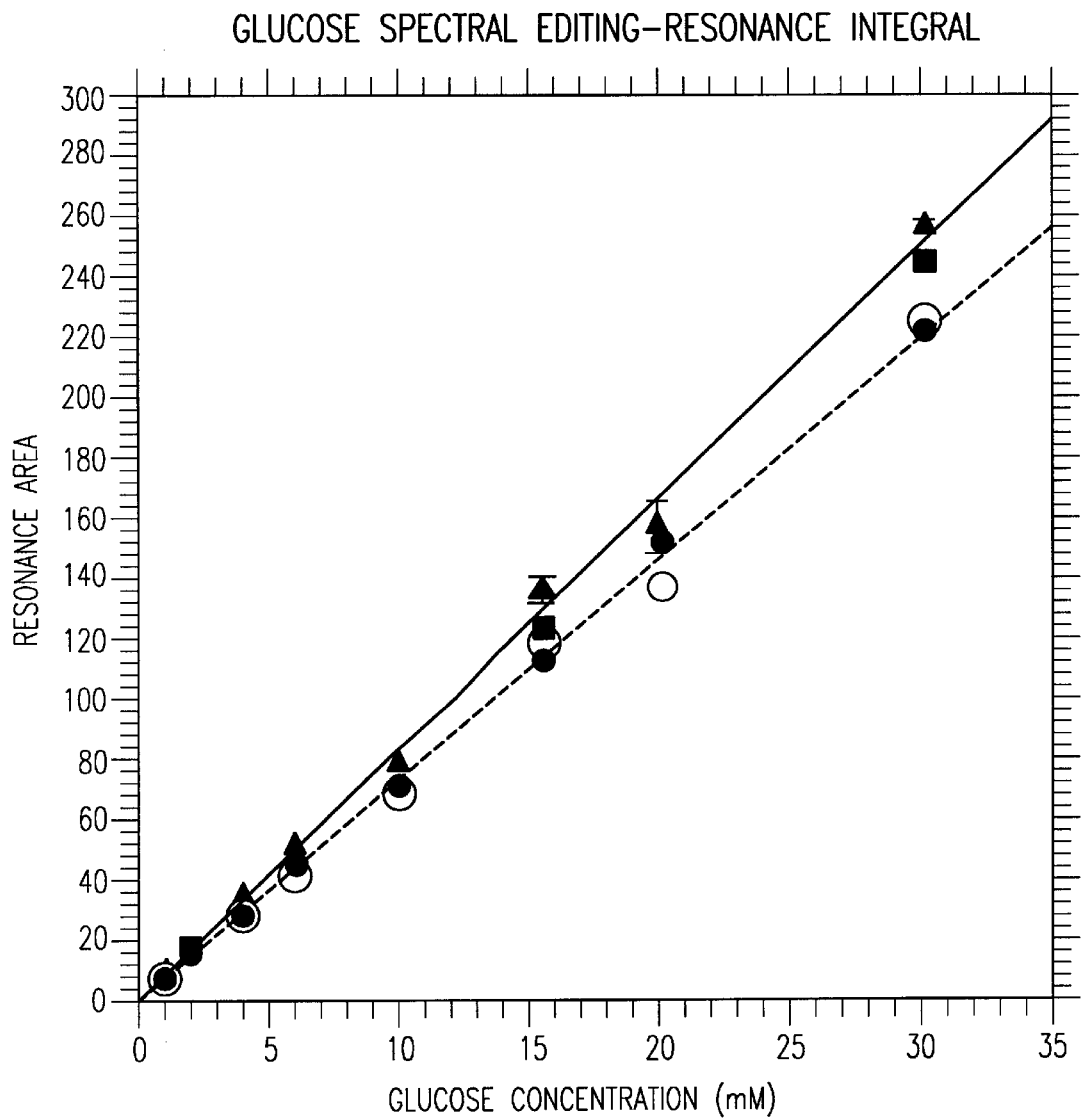
FIG. 19 is a plot of resonance area against sample glucose concentration produced using the RF pulse sequence illustrated in FIG. 18.

Synthetic samples of plasma as well as human plasma samples were prepared containing known amounts of glucose in the concentration range of 1 to 30 mM. 5.5 mM glucose is considered normal. Actual glucose concentrations were checked by the use of standard clinical chemistry procedures. The pulse sequence illustrated in FIG. 18 was applied to the samples, and the glucose concentration was determined by detecting the proton resonance of glucose. The experimental results are illustrated in FIG. 19 which shows resonance area (integral) plotted against actual glucose concentration.

In the method of the invention, the pulse sequence is applied one or more times to the test sample. For the pulse sequence shown in FIG. 15, the presently preferred sampling time is about 200 msec to about 206 msec, and preferably about 203.9 msec, for the magnetic field strength used. Following sample irradiation, a proton spectrum is generated by recording the FID of the sample and performing a Fourier transform on the decay data. The signal will be calibrated relative to the signal of a glucose standard of a known concentration of glucose. In a presently preferred embodiment, a predetermined value stored in the apparatus computer is used for the calibration. In the proton spectrum generated, the water proton chemical shift is used as an internal reference for the $^1$H chemical shift values. The reference avoids measurement error arising from small changes in the polarizing magnetic field strength which in turn would lead to apparent changes in resonance frequency.

Additionally, any effect on the glucose signal produced by the hydration level of the patient is corrected. In a presently preferred method of correcting for such an effect, the water signal produced by the test sample, i.e., the patient's finger, is used as a measure of the patient's hydration, which is then corrected for using an experimentally determined calibration factor. The calibration factor is proportional to the efficiency of the pulse sequences used to produce the water and glucose signals as well as the effect of the patient's hydration level on the glucose signal. Resonance peak areas are then determined in order to provide a measurement of the glucose levels in the test sample.

Multiple coupled pairs can be selectively excited and detected simultaneously using the pulse sequence of the invention, as illustrated in FIG. 15, to increase the confidence levels for glucose detection. Moreover, the pulse sequence of the invention could be adapted for selective detection of molecules other than glucose by constructing or designing selective pulses that would excite and detect pairs or multiple pairs of coupled spins in the molecule. The duration, shape, and frequency excitation region (i.e. 5.4 ppm in the pulse sequence discussed above) of the selective pulses would be changed to adapt the pulse sequence of the invention to the selective detection of different pair or group in the same molecule or in a different molecule.

While the present invention has been described herein in terms of certain preferred embodiments, those skilled in the art will recognize that modifications and improvements may be made to the invention without departing from the scope thereof.

What is claimed is:

1. A magnet assembly for providing a substantially homogeneous magnetic field within a test region for an NMR apparatus, comprising:

a) a pair of opposed permanent magnets, each magnet having a back surface, a front surface facing the opposing permanent magnet front surface and one or more side surfaces between the front and back surfaces;

b) a pair of opposed pole cap members, each pole cap member having a back surface adjacent the front surface of one of the permanent magnets and having a front surface defining at least in part the test region between the pole cap members and facing the opposing pole cap member front surface and each pole cap member having a radially tapered side surface extending from the back surface toward the front surface, of the pole cap member of the pole cap member, c) a plurality of annular canceling magnets, the canceling magnets encircling the side surfaces of the permanent magnets and the pole cap members, and being radially polarized; and d) a pair of opposed annular ring shims, each annular ring shim encircling at least in part the side surface of a pole cap member adjacent the front surface of the pole cap member, each annular ring shim having a length from a front surface to a back surface of the ring shim which is less than a length of the pole cap member from the front surface to the back surface of the pole cap member.

2. The magnet assembly of claim 1 wherein a magnetic field of 1.4 Tesla is produced in the test region between the pole cap front surfaces, and the magnet assembly has a weight of not greater than about 62 kilograms.

3. The magnet assembly of claim 2 wherein the permanent magnets are about 15.5 cm to about 17 cm in diameter.

4. The magnet assembly of claim 2 wherein the permanent magnets are about 2.4 cm to about 2.6 cm in width.

5. The magnet assembly of claim 3 including a pair of yoke members extending beyond the permanent magnets and having a thickness of about 1.4 cm to about 2.0 cm, each yoke member having a front surface adjacent the back surface of one of the permanent magnets.

6. The magnet assembly of claim 5 including a housing having a thickness of about 0.2 cm to about 0.5 cm, the housing including a port providing access to the test region between the pole caps.

7. The magnet assembly of claim 6 wherein the magnet assembly has outside square dimensions of about 30 cm to about 50 cm and a length of about 25 cm to about 40 cm.

8. The magnet assembly of claim 1 wherein the canceling magnets have a thickness from the inner to the outer surface of about 6.5 to about 9.0 mm.

9. The magnet assembly of claim 1 wherein the canceling magnets have a thickness that increases toward a front surface of the canceling magnet facing the test region.

10. The magnet assembly of claim 1 wherein the ring shim has a surface in contact with a surface of the pole cap member.

11. The magnet assembly of claim 1 wherein the ring shim extends from behind the pole cap member front surface to a location spaced in front of the pole cap member front surface.

12. The magnet assembly of claim 1 wherein the ring shim is disposed in an annular groove in a peripheral portion of the pole cap front surface at a junction between the front surface of the pole cap member and the tapered side surfaces of the pole cap member.

13. The magnet assembly of claim 1 wherein the ring shim has a rectangular cross section.

14. The magnet assembly of claim 1 wherein an outer side of the ring shim is directed away from a surface of the pole cap member and is tapered.

15. The magnet assembly of claim 14 wherein a front edge of the ring shim tapered outer side is curved so that magnetic field homogeneity in the test region is increased.

16. The magnet assembly of claim 15 wherein a front edge of an inner side of the ring shim is curved so that magnetic field homogeneity in the test region is increased.

17. The magnet assembly of claim 6 including a back plate member between the yoke member and the permanent magnet.

18. The magnet assembly of claim 1 wherein the permanent magnets are a neodymium-iron-boron alloy.

19. The magnet assembly of claim 1 wherein the pole caps are iron.

20. The magnet assembly of claim 1 having at least 3 canceling magnets disposed about each pole cap, 1 canceling magnet disposed about each permanent magnet, and 1 canceling magnet disposed about the interface of each pole cap and permanent magnet.

21. The magnet assembly of claim 1 wherein at least a section of a canceling magnet is radially aligned with the ring shim.

22. The magnet assembly of claim 1 wherein the ring shims are a ferromagnetic material.

23. The magnet assembly of claim 1 having a plurality of canceling magnets longitudinally displaced from adjacent canceling magnets along a length of each pole cap member.

24. The magnet assembly of claim 23 wherein the canceling magnets have an inner surface at least a section of which is spaced away from a surface of the pole cap member.

25. The magnet assembly of claim 1 wherein the canceling magnets are a neodymium-iron-boron alloy.

26. The magnet assembly of claim 17 wherein the back plate member has a thickness of about 0.2 to about 0.5 cm.

27. The magnet assembly of claim 5 wherein the yoke member has a centrally tapering back surface.

28. A magnet assembly for providing a substantially homogeneous magnetic field within a test region for an NMR apparatus, comprising:
  a) a pair of opposed permanent magnets, each magnet having a back surface, a front surface facing the opposing permanent magnet front surface and a side surface extending between the back and front surfaces;
  b) a pair of opposed pole cap members, each pole cap member having a back surface adjacent the front surface of one of the permanent magnets and a front surface that defines at least in part a test region between the pole cap members that faces the opposing pole cap member front surface, and each pole cap member having radially tapered side surfaces extending from the back surface of the pole cap member toward the front surface of the pole cap member; and
  c) a plurality of annular canceling magnets encircling the side surface of the pole cap member, which are adjacent to and longitudinally displaced from one another, and at least one annular canceling magnet encircling the side surfaces of the pole cap member and the permanent magnet at a junction therebetween, which has a height from an inner surface to an outer surface greater than a height of the canceling magnets encircling the pole cap member, and at least one annular canceling magnet encircling the side surface of the permanent magnet which has a height from an inner surface to an outer surface less than the height of the canceling magnets encircling around the pole cap member.

29. A NMR apparatus for measurement of a constituent concentration in a patient, comprising:
  a) a magnet assembly for providing a substantially homogeneous magnetic field within a test region, comprising
    a pair of opposed permanent magnets, each magnet having a back surface, a front surface facing the opposing permanent magnet front surface and one or more side surfaces disposed between the front and back surfaces;
    a pair of opposed pole cap members, each pole cap member having a back surface adjacent the front surface of one of the permanent magnets, a front surface facing the opposing pole cap member front surface, and a radially tapered side surface extending from the back surface of the pole cap member toward the front surface of the pole cap member; and
    a plurality of annular canceling magnets encircling the side surfaces of the permanent magnets and pole cap members and being radially polarized;
  b) a pair of opposed annular ring shims, each annular ring shim encircling at least in part the side surface of a pole cap member adjacent the front surface of the pole cap member, each annular ring shim having a length from a front surface to a back surface of the ring shim which is less than a length of the pole cap member from the front surface to the back surface of the pole cap member;
  c) a coil; and
  d) a test region defined at least in part by said pole caps and said coil.

* * * * *

UNITED STATES PATENT AND TRADEMARK OFFICE
CERTIFICATE OF CORRECTION

PATENT NO. : 6,163,154
DATED : December 19, 2000
INVENTOR(S) : Anderson et al.

It is certified that error appears in the above-identified patent and that said Letters Patent is hereby corrected as shown below:

Column 12,
Line 46, before "toward" insert -- of the pole cap member --.

Signed and Sealed this

Eleventh Day of December, 2001

Attest:

*Attesting Officer*

NICHOLAS P. GODICI
*Acting Director of the United States Patent and Trademark Office*